(12) United States Patent
Yeo et al.

(10) Patent No.: US 6,521,939 B1
(45) Date of Patent: Feb. 18, 2003

(54) HIGH PERFORMANCE INTEGRATED VARACTOR ON SILICON

(75) Inventors: Kiat-Seng Yeo, Singapore (SG); Chun Qi Geng, Singapore (SG); Kok-Wai Chew, Singapore (SG); Manh-Anh Do, Singapore (SG); Jian Guo Ma, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/672,764

(22) Filed: Sep. 29, 2000

(51) Int. Cl.[7] .................... H01L 27/108; H01L 29/76
(52) U.S. Cl. .................. 257/312; 438/197; 438/379; 257/595
(58) Field of Search .................. 438/197, 203, 438/211, 379; 257/312, 595, 598, 29.345, 296

(56) References Cited

U.S. PATENT DOCUMENTS

| | | | |
|---|---|---|---|
| 4,170,818 A | 10/1979 | Tobey, Jr. et al. | 29/571 |
| 4,226,648 A | 10/1980 | Goodwin et al. | 148/175 |
| 5,173,835 A | 12/1992 | Cornett et al. | 257/310 |
| 5,405,790 A | 4/1995 | Rahim et al. | 438/202 |
| 5,854,117 A | 12/1998 | Huisman et al. | 438/379 |

OTHER PUBLICATIONS

Hung et al., " High–Q Capacitors Implemented in a CMOS Process for Low–Power Wireless Applications", IEEE Tran. on Microwave Theory and Techiques, vol. 46, No. 5, May 1998, pp. 505–511.*

Hung et al. " A 25.9 GHz Voltage–Cintrolled Oscillator Fabricated in a CMOS Process", 2000 Sym. on VLSI Circuits Digest of Technical papers, pp. 100–101.*

Dec et al.," Micromachined varactor with wide tuning range", Electronic Letters May 22nd, 1997, vol. 33, No. 11, pp. 922–924.*

A.S. Porret et al., "Design of High–Q Varactors for Low–Power Wireless Application using a Standard CMOS Process," IEEE 1999 Custom Integrated Circuits Conference.

R.Castello et al., "A+/–30% Tuning Range Baractor Compatible with Future Scaled Technologies," 1998 Symposium on VlSI Circuits Digest of Technical Papers, pp. 34–35, Jun. 1998.

W.Wang et al., "Wide Tuning Range Inversion–Mose Gated Varactor and Its Application on a 2–GHz VCO," 1999 Symposium on VLSI Circuits Digest of Technical Papers.

(List continued on next page.)

Primary Examiner—Olik Chaudhuri
Assistant Examiner—Ming Lee
(74) Attorney, Agent, or Firm—George O. Saile; Rosemary L. S. Pike; Douglas R. Schnabel

(57) ABSTRACT

A new MOS varactor device is described. A bottom electrode comprises a plurality of diffusion junctions in a semiconductor substrate. The semiconductor substrate may be n-type or p-type. The diffusion junctions are arranged in a two-dimensional array. The diffusion junction may be either n-type or p-type. The diffusion junctions may be contained in a p-well or an n-well. A dielectric layer overlies the semiconductor substrate. A top electrode overlies the dielectric layer. The top electrode comprises a single polygon containing a two-dimensional array of openings therein that exposes the diffusion junctions. The top electrode preferably comprises polysilicon. An interlevel dielectric layer overlies the top electrode and the diffusion junction. The interlevel dielectric layer has a two-dimensional array of contact openings that expose the underlying diffusion junctions. A patterned metal layer overlies the interlevel dielectric layer and contacts the diffusion junctions through the contact openings.

20 Claims, 11 Drawing Sheets

OTHER PUBLICATIONS

F.Svelto et al., "A Metal–Oxide–Semiconductor Varactor," IEEE electron Device Letters, vol. 20, No. 4, pp. 164–166, 1999.

J.N. Burghartz et al., "Integrated RF Components in Sige Bipolar Technology," IEEE J. Solid State Circuits, vol. 32, No. 9, pp. 1440–1445, 1997.

T. Soorapanth et al., "Analysis and Optimization of Accumilation–Mode Varactor for RF ICs," 1998 Symposium on VLSI Circuits Digest of Technical Papers, pp. 32–33, Jun. 1998.

C.M. Hung et al., "High–Q Capacitors Implemented in a CMOS Process for Low–Power Wireless Applications," IEEE Tran. Microwave Theory Tech–, vol. 46, pp. 505–510, May 1998.

* cited by examiner

Accumulation Model

Depletion Model

Accumulation Model

Depletion Model

HIGH PERFORMANCE INTEGRATED VARACTOR ON SILICON

BACKGROUND OF THE INVENTION (1) Field of the Invention

The invention relates to a method of fabricating Semiconductor devices, and more particularly, to the formation of a high performance varactor on silicon in the manufacture of integrated circuit devices.

(2) Description of the Prior Art

A key building block of a CMOS monolithic transceiver is the Phase Locked Loop (PLL) circuit. PLL performance is largely dependent on the characteristics of the voltage-controlled oscillator (VCO). In turn, the monolithic integration of VCO circuits onto silicon-based radio frequency (RF) integrated circuits depends upon the ability to fabricate high quality on-chip varactors. A varactor is defined as a voltage-variable capacitor.

Silicon has been identified as one of the key materials in meeting the demands of wireless communications applications. Silicon-based integrated circuits represent a mature technology with low fabrication costs and high packing density. However, the difficulty of realizing high quality factor (Q) varactors with large tuning ranges remains a great challenge for silicon-based RF integrated circuit design and fabrication.

Most conventional on-chip, or integrated, varactors are implemented as either reverse-biased p-n junctions or as accumulation-mode MOS capacitors. Reverse-biased p-n junction varactors exhibit a limited tuning range for low supply voltages due to technology scaling and reliability issues. Prior art accumulation-mode MOS capacitor varactors exhibit low Q values.

Referring to FIG. 1, a cross-section of a typical MOS varactor is shown. A semiconductor substrate 10 is shown. The semiconductor substrate could comprise either an n-type or a p-type region. A well 17 may be formed in the semiconductor substrate. A drain 15 and a source 16 are formed in the substrate 10 and in the well 17, if used. A thin gate oxide layer 14 is formed overlying the semiconductor substrate 10. A gate electrode 18 is formed overlying the thin gate oxide layer 14. A voltage potential ($V_G$) can be applied to the gate electrode while the drain 15 and the source 16 are connected together to form the other electrode. The drain 15 and the source 16 are commonly called the diffusion.

A prior art MOS varactor comprises a drain 15 and the source 16 of n+ diffusions, an n-well 17, and the p-type substrate 10. The operation of the MOS varactor is described below. The gate 18 and the drain 15 and source 16 contacts are the controlling electrodes. The device capacitance is given by $C = C_0 WL$, where W is the gate width, L is the gate length, and $C_0$ is given by:

$$C_0 = ((1/C_{OX}) + (1/C_{OX}))^{-1}$$

in which $C_{OX}$ and $C_{Si}$ are, respectively, the oxide capacitance and the capacitance of the depletion layer under the gate, per unit area. By applying a positive voltage between the gate 18 and the n-well 17, the surface is accumulated and the device capacitance equals the oxide capacitance, $C_{OX}$. If the applied voltage is reversed, the surface layer is depleted and the series capacitance decreases. The maximum capacitance, per unit area, of the device corresponds to a heavily accumulated surface and equals $C_{OX} = \epsilon/t_{OX}$, where $t_{OX}$ is the thickness of the gate oxide layer. On the other side, the minimum value ($C_{dmin}$) is reached when the voltage difference between the electrode equals the threshold voltage. Beyond this point, an inversion layer is formed under the gate. At low frequency, this effect brings the value of the device capacitance close to the oxide capacitance. At high frequency, where the varactor is typically operated, this effect is not seen and the capacitance remains at its minimum value.

Referring now to FIG. 2, a top view of a prior art MOS varactor is shown. Here, the gate electrode 18 is shown intersecting a section of the diffusion 15 and 16. The varactor is formed by the intersection. This varactor forms a one-dimensional cell where the drain and source sides of the capacitor go in a single direction.

Referring now to FIG. 3, an equivalent circuit model of the prior art varactor in the accumulation mode is shown. The varactor is modeled as a series of passive components connected in a network. The gate electrode is modeled as a series inductance ($L_s$) 50, a gate resistance ($R_g$) 52, a gate oxide capacitance ($C_{ox}$) 54, and a semiconductor capacitance ($C_{si}$) 56. The substrate is modeled as a well capacitance ($C_w$) 68 and a well resistance ($R_w$) 66. The drain and source regions are each modeled as a first dimension accumulation layer resistance ($R_{acc(1)}$) 60 and 62 and a first dimension lightly doped drain (LDD) and contact resistance ($R_{d(1)}$) 58 and 64. The drain and source and the substrate are grounded 72 while the variable voltage is applied to the gate 70.

Referring now to FIG. 4, an equivalent circuit model of the prior art varactor in the depletion mode is shown. The gate is again modeled as a series inductance ($L_s$) 50, a gate resistance ($R_g$) 52, and a gate oxide capacitance ($C_{ox}$) 54. In depletion, however, the semiconductor capacitance ($C_{si}$) 56 is attached to the substrate rather than the gate. The substrate is also modeled as a well capacitance ($C_w$) 68 and a well resistance ($R_w$) 66. The drain and source regions are each modeled as a first dimension lightly doped drain (LDD) and contact resistance ($R_{d(1)}$) 58 and 64 and a first dimension channel-to-S/D depletion capacitance ($C_{d(1)}$) 74 and 76.

The changes in the equivalent circuit model of the varactor from the accumulation mode (FIG. 3) to the depletion mode (FIG. 4) reflect the presence of the depletion region underlying the gate oxide layer 14 during depletion mode. The effective series resistance of the prior art MOS varactor in accumulation mode is given by:

$$R_s = R_{acc(1)}/2.$$

The effective series resistance in depletion mode is given by:

$$R_s = R_w (C_{si}/(C_{si} + 2C_{d(1)}))^2.$$

The effective series capacitance in the accumulation mode is given by:

$$C_s = C_{ox} C_{si}/(C_{ox} + C_{si}).$$

Finally, the effective series capacitance in the depletion mode is given by:

$$C_s = (C_{ox}(C_{si} + 2C_{d(1)}))/(C_{ox} + C_{si} + 2C_{d(1)}).$$

Several prior art approaches disclose methods to form on-chip varactors in the manufacture of an integrated circuit device. U.S. Pat. No. 5,405,790 to Rahim et al discloses a p-n junction varactor fabricated in a BiCMOS process. U.S. Pat. No. 5,173,835 to Cornett et al teaches a metal-insulator-silicon (MIS) varactor. A metal oxide, such as zirconium titanate, is used for the dielectric insulator. A high resistivity layer is used underlying the insulator to support large depletion regions under negative bias. U.S. Pat. No. 4,170,818 to Tobey, Jr. et al discloses a method to form a voltage reference circuit based on differences in the gate-to-channel barriers between two JFET devices. U.S. Pat. No. 5,854,117 to Huisman et al teaches a method to form a varicap diode p-n junction for use as a varactor. U.S. Pat. No. 4,226,648 to Goodwin et al discloses a method to form a hyper-abrupt varactor diode p-n junction. A. S. Poret et al, "Design of High-Q Varactors for Low-Power Wireless Application using a Standard CMOS Process," IEEE 1999 Custom Integrated Circuits Conference, teaches a varactor. R. Castello et al, "A +/−30% Tuning Range Varactor Compatible with Future Scaled Technologies," 1998 Symposium on VLSI Circuits Digest of Technical Papers, pp.34–35, June 1998, teaches a varactor. W. Wong et al, "Wide Tuning Range Inversion-Mode Gated Varactor and Its Application on a 2-GHz VCO," 1999 Symposium on VLSI Circuits Digest of Technical Papers, teaches a varactor. F. Svelto et al, "A Metal-Oxide-Semiconductor Varactor," IEEE Electron Device Letters vol. 20, no.4, pp.164–166, 1999, teaches a varactor. J. N. Burghartz et al, "Integrated RF Components in a SiGe Bipolar Technology," IEEE J. Solid State Circuits, vol.32, no.9, pp.1440–1445, 1997, teaches a varactor. T. Soorapanth et al, "Analysis and Optimization of Accumulation-Mode Varactor for RF Ics," 1998 Symposium on VLSI Circuits Digest of Technical Papers, pp.32–33, June 1998, teaches a varactor. C. M. Hung et al, "High-Q Capacitors Implemented in a CMOS Process for Low-Power Wireless Applications," IEEE Tran. Microwave Theory Tech, vol.46, pp.505–510, May 1998, teaches a varactor.

SUMMARY OF THE INVENTION

A principal object of the present invention is to provide an improved varactor device for use in an integrated circuit device.

A further object of the present invention is to provide an improved varactor device that is integrated in a standard MOS process.

A yet further object of the present invention is to improve the Q-value of a varactor device by using a two-dimensional array layout technique.

Another yet further object of the present invention is to reduce the effective resistance of the varactor device by using a two-dimensional array layout technique.

Another further object of the present invention is to provide an effective and very manufacturable method of fabricating an improved varactor device in the manufacture of an integrated circuit.

In accordance with the objects of this invention, a new MOS varactor device is described. A bottom electrode comprises a plurality of diffusion junctions in a semiconductor substrate. The semiconductor substrate may be n-type or p-type. The diffusion junctions are arranged in a two-dimensional array. The diffusion junction may be either n-type or p-type. The diffusion junctions may be contained in a p-well or an n-well. A dielectric layer overlies the semiconductor substrate. A top electrode overlies the dielectric layer. The top electrode comprises a single polygon containing a two-dimensional array of openings therein that exposes the diffusion junctions. The top electrode preferably comprises polysilicon. An interlevel dielectric layer overlies the top electrode and the diffusion junction. The interlevel dielectric layer has a two-dimensional array of contact openings that expose the underlying diffusion junctions. A patterned metal layer overlies the interlevel dielectric layer and contacts the diffusion junctions through the contact openings.

Also in accordance with the objects of this invention, a new method of fabricating a MOS varactor device has been achieved. A semiconductor substrate of either n-type or p-type is provided. A well of either n-type or p-type may be formed in the semiconductor substrate. A dielectric layer is formed overlying the semiconductor substrate. A top electrode layer, preferably of polysilicon, is deposited overlying the dielectric layer. The top electrode layer is patterned to form a single polygon containing a two-dimensional array of openings therein. Ions are implanted into the semiconductor substrate through the two-dimensional array of openings to form diffusion junctions of either n-type or p-type. The diffusion junctions are thereby formed as a two-dimensional array. An interlevel dielectric layer is deposited overlying the polysilicon layer and the diffusion junctions. The interlevel dielectric layer is patterned to form a two-dimensional array of contact openings to the underlying diffusion junctions. A metal layer is deposited overlying the dielectric layer and filling the contact openings. The metal layer is patterned to complete the manufacture of the integrated circuit device.

BRIEF DESCRIPTION OF THE DRAWINGS

In the accompanying drawings forming a material part of this description, there is shown.

DESCRIPTION OF THE PREFERRED EMBODIMENTS

The method and novel layout of the present invention is applied to the formation of an MOS varactor in a semiconductor substrate. A preferred embodiment of the novel MOS varactor device is also described. It should be clear to those experienced in the art that the present invention can be applied and extended without deviating from the scope of the present invention.

Figure 1:
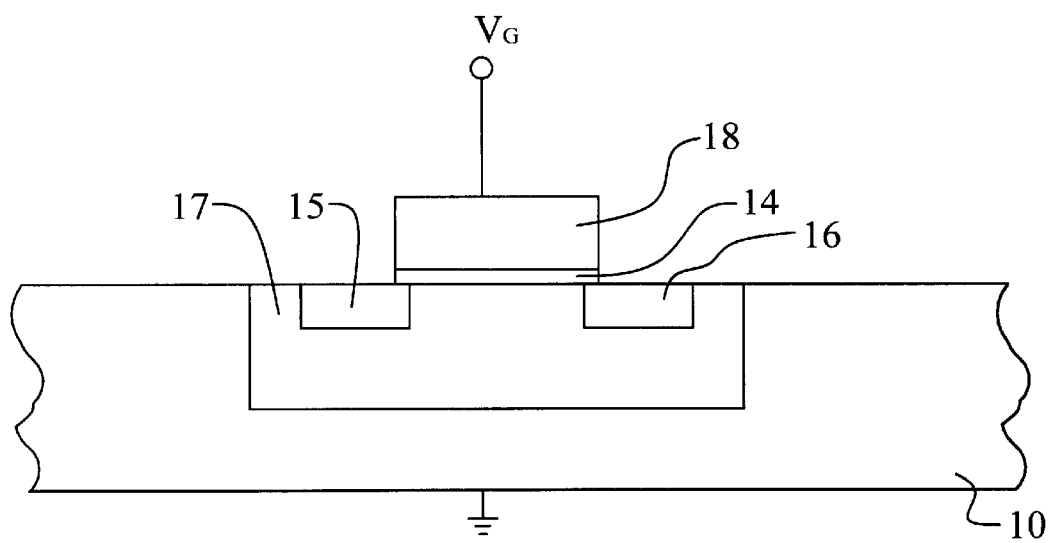
FIG. 1 schematically illustrates in cross-section a partially completed prior art MOS varactor.
Figure 2:
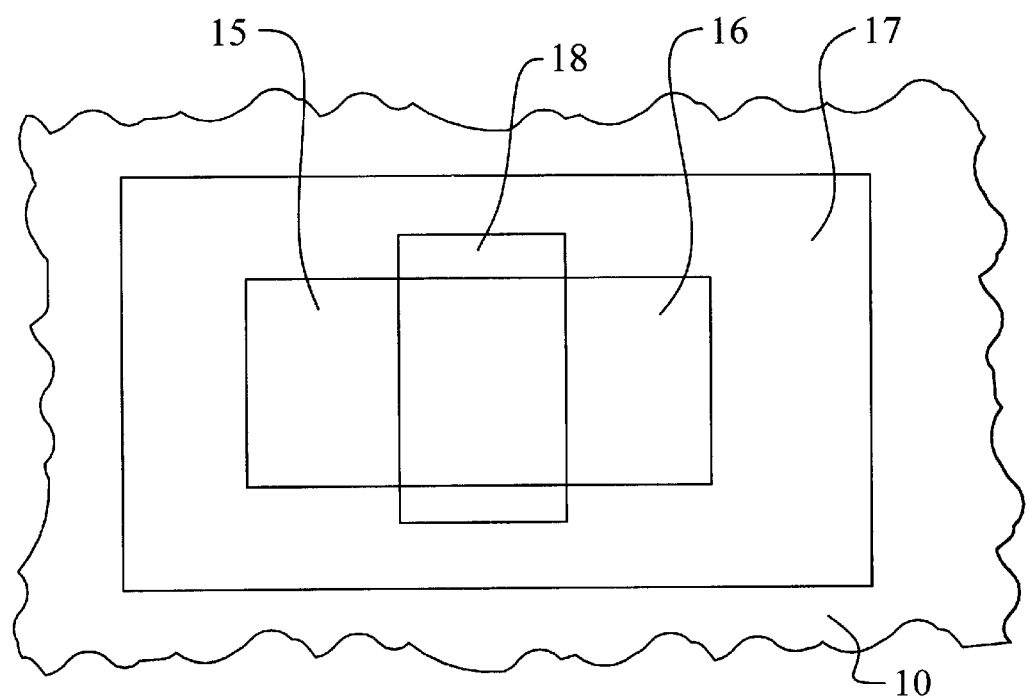
FIG. 2 schematically illustrates a top view layout of a partially completed prior art MOS varactor.
Figure 3:
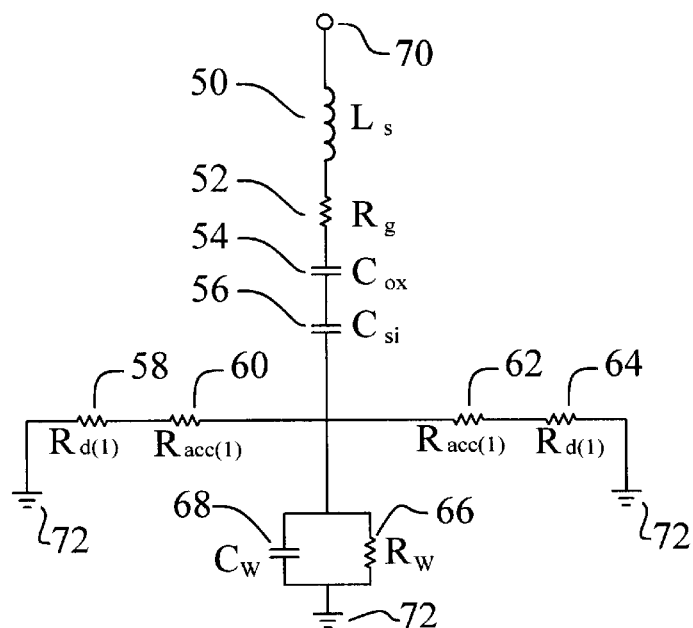
FIGS. 3 and 4 schematically illustrate equivalent circuit models for a prior art MOS varactor in accumulation and depletion modes.
Figure 4:
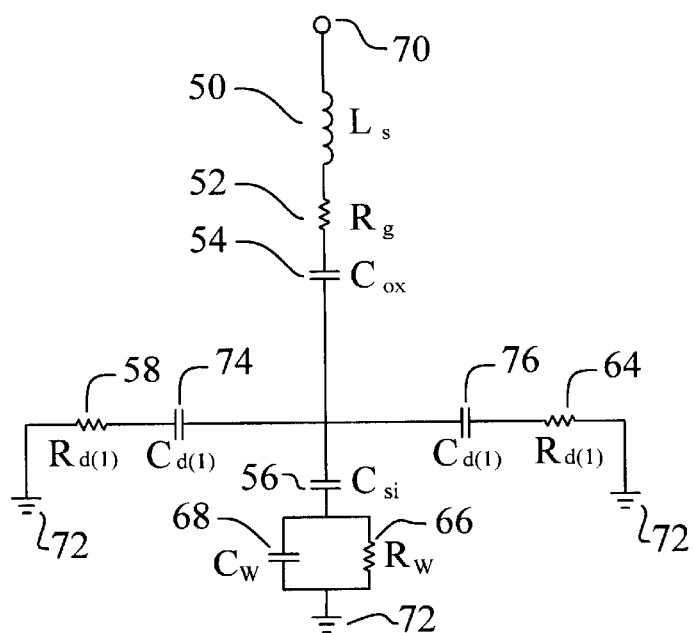
Figure 5:
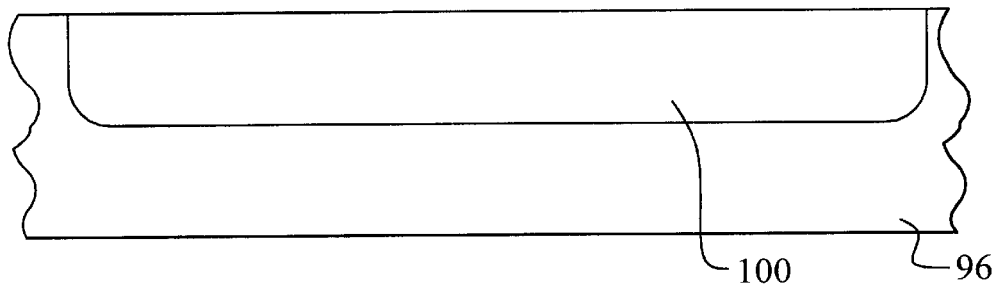
FIGS. 5 through 9 schematically illustrate in cross-sectional representation a preferred embodiment of the present invention.

Referring now more particularly to FIG. 5, a cross-sectional view of the partially completed preferred embodiment is shown. A semiconductor substrate 96 is provided. The semiconductor substrate 96 preferably comprises monocrystalline silicon fabricated by methods well known in the art. The semiconductor substrate 96 may be doped either p-type or n-type.

A well junction 100 may be formed in the semiconductor substrate 96. The well junction 100 is optional to the present invention. As an example, if the semiconductor substrate 96 is p-type, then the well junction 100 could be n-type, in which case it shall be termed the n-well junction 100. Alternatively, if the well junction 100 is p-type, it would be termed a p-well junction 100.

Similar to the substrate, the purpose of the well junction 100 is to form the depletion region for the varactor. The change in capacitance of the varactor depends upon this depletion region. If the MOS varactor device is fabricated in a conventional MOS process, then the well junction 100 may comprise the same junction type used for formation of MOS transistors.

The well junction 100 may be formed by a diffusion or by an ion implantation followed by a thermal drive-in. Either method is well known in the art. The particular concentration and depth of the well junction 100 will depend upon the MOS process in which the varactor is being fabricated.

Figure 6:
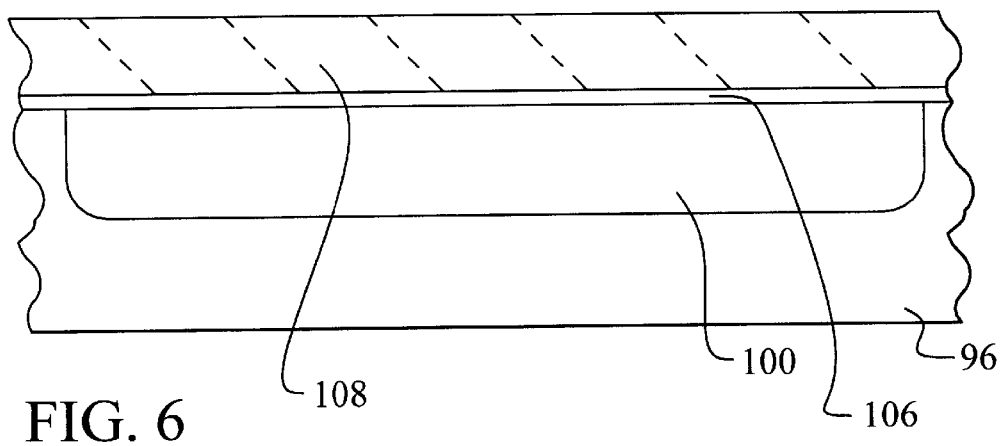

Referring now to FIG. 6, a dielectric layer 106 is formed overlying the semiconductor substrate 96. The dielectric layer 106 will serve as the capacitor dielectric for the MOS varactor device. If the MOS varactor device is formed in a conventional MOS process, then the dielectric layer 106 may comprise the gate dielectric layer for MOS transistor devices. The dielectric layer 106 may comprise silicon dioxide, though the present invention is not limited to silicon dioxide and other dielectric materials may be used. If silicon dioxide is used, it may be grown by thermal oxidation of the semiconductor substrate 96 or deposited by chemical vapor deposition (CVD).

A top electrode layer 108 is deposited overlying the dielectric layer 106. The top electrode layer 108 will serve as the top electrode or plate of the varactor. Preferably, the top electrode layer 108 comprises polysilicon. The present invention is not limited to polysilicon as the top electrode material and other materials may be used. If the varactor device is fabricated in a conventional MOS process flow, the top electrode layer 108 may additionally form the gate electrode layer for MOS transistors devices. The top electrode layer 108 may be doped or undoped. Preferably, the top electrode layer 108 is doped to reduce the series resistance of the varactor.

Figure 7:
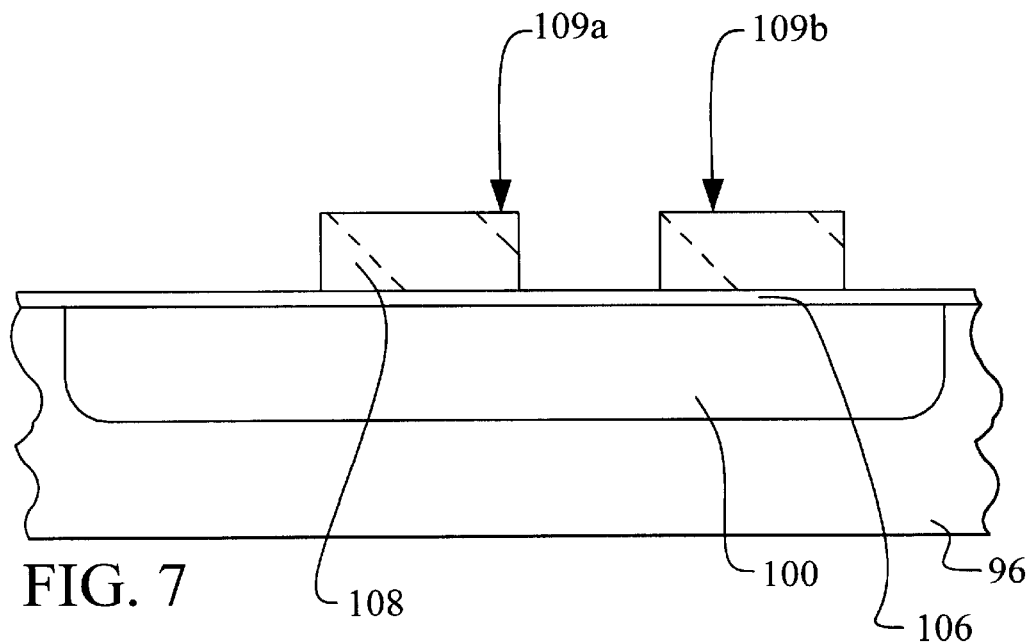
Figure 10:
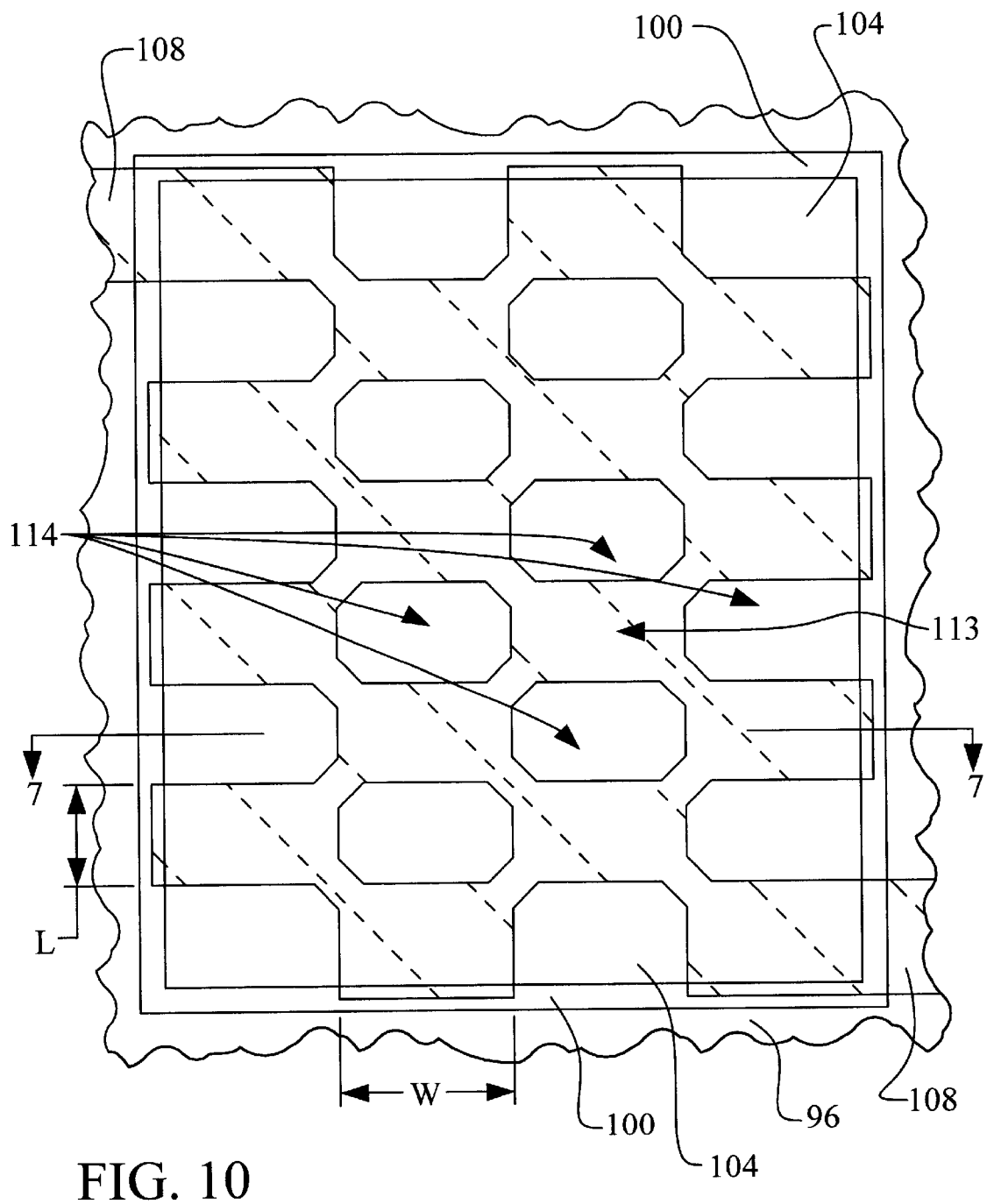
FIGS. 10 and 11 schematically illustrate the top view layout of a preferred embodiment of the present invention.

Referring now to FIG. 7 an important feature of the present invention is illustrated. The top electrode layer 108 is patterned to form a single polygon with a two-dimensional array of openings. Since the top electrode layer 108 is patterned into a single polygon, the top electrode sections 109a and 109b are connected out of the plane of this cross-section. The preferred arrangement of the two-dimensional array of openings in the top electrode layer 108 is shown in the top view FIG. 10. In FIG. 10, the array of openings is labeled 114. The exposed areas of the substrate 96 or well junction 100 will subsequently be ion implanted to form the diffusion junctions for the bottom plate of the varactor device. Referring again to FIG. 7, note that the patterning step for the top electrode layer 108 may also be used to pattern the gate electrodes for concurrently formed MOS transistors. The top electrode 108 is thereby formed.

Figure 8:
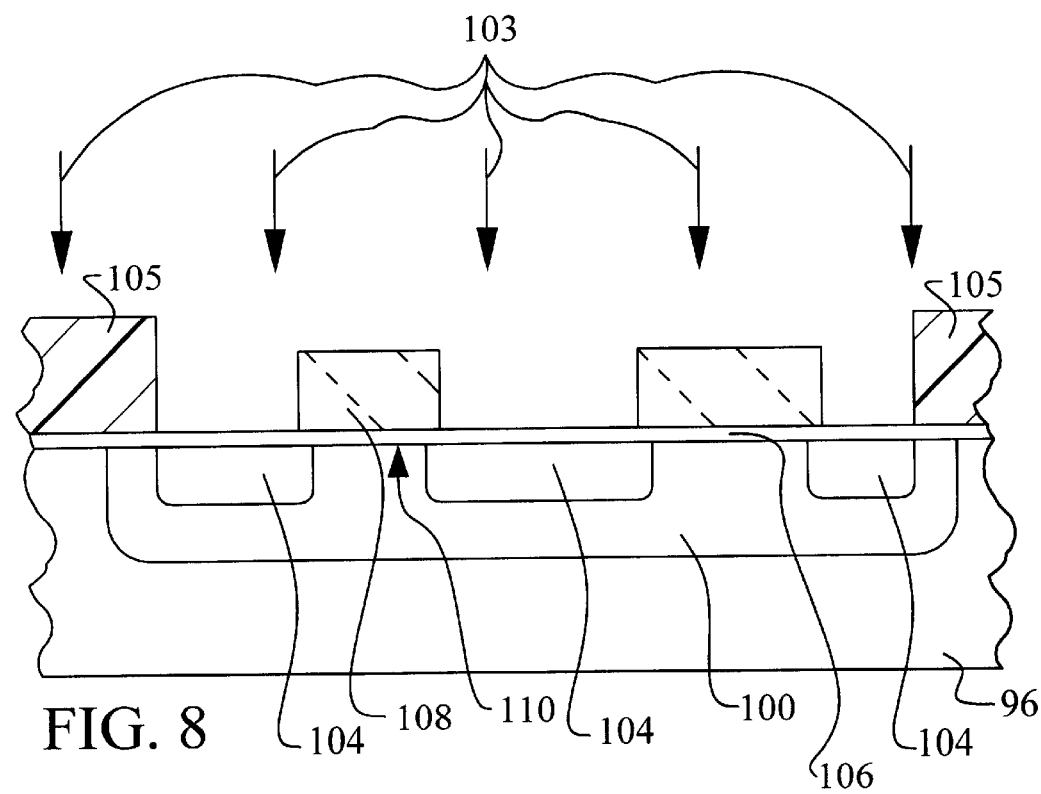

Referring now to FIG. 8, an important feature of the present invention is illustrated. Ions are implanted 103 through the two-dimensional array of openings in the top electrode 108 and into the exposed well junction 100 to form the diffusion junctions 104. The diffusion junctions 104 are heavily doped and may be n-type or p-type, depending upon the MOS process in which the varactor is fabricated.

The diffusion junctions 104 are an important feature of the present invention. The diffusion junctions 104 form the bottom electrode or plate of the varactor. The diffusion junctions 104 are preferably heavily doped junctions to minimize resistance. As can be seen, channel regions 110, are formed underlying the top electrode of the device and between the diffusion junctions 104. The channel regions 110 are lightly doped so that a change in voltage potential across the channel will create a relatively large change in the size of the depletion region. This translates into a large change in the effective capacitance.

It is important to note that the diffusion junctions 104 could be n-type or p-type, the well junction 100 could be n-type or p-type, and the substrate 96 could be n-type or p-type. The diffusion junctions 104 may be formed by the same processing step used for forming the source or drain junctions of MOS transistors if the varactor device is fabricated in a conventional MOS process sequence.

A masking layer 105 is used to mask the implantation from unwanted areas. The masking layer 105 may comprise, for example, photoresist 105 that is applied, exposed through a reticle, and developed. After the ion implantation 103, the masking layer 105 is removed by a stripping process.

Figure 9:
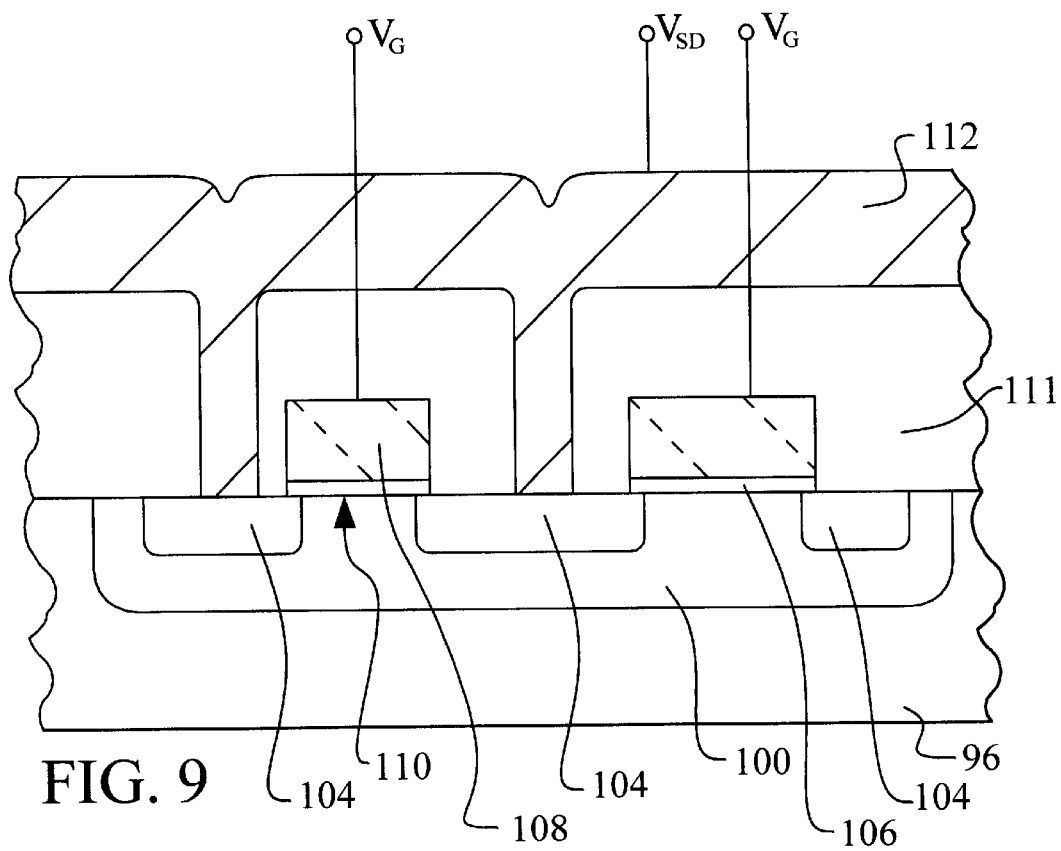

Referring now to FIG. 9, an interlevel dielectric layer 111. is deposited overlying the top electrode 108 and the diffusion junctions 104. The interlevel dielectric layer 111 isolates the top electrode 108 and the diffusion junctions 104 from a subsequently deposited metal layer. The interlevel dielectric layer 111 comprises, for example, silicon dioxide deposited by a CVD process. The present invention is not limited to the use of silicon dioxide for the interlevel dielectric layer 111. Other dielectric materials may be used.

A two-dimensional array of contact openings is patterned in the interlevel dielectric layer 111 to expose the underlying diffusion junctions 104. The array of contact openings 116 is shown in the top view FIG. 11. Referring again to FIG. 9, a metal layer 112 is deposited overlying the interlevel dielectric layer 111 and filling the contact openings. The metal layer 112 is patterned to form interconnect lines and to complete the manufacture of the integrated circuit device. The varactor of the present invention is thereby fabricated in a standard CMOS process.

Referring now to FIG. 10, important features of the present invention are illustrated. A top view of the partially completed device of FIG. 7 is shown. The well 100 is shown in the semiconductor substrate 96. The top electrode 108 overlies the dielectric layer 106 that is not shown. The top electrode 108 is uniquely patterned to form a single polygon with a two-dimensional array of openings to the underlying well 100. The diffusion junctions 104 are formed in the openings of the top electrode 108.

Note how the intersections of the top electrode 108 and the well junction 100 form the electrodes 113 of the varactor. Each electrode 113 is surrounded by four diffusion junctions, here labeled as contact areas 114, for the back plate of the varactor. By surrounding each electrode 113 with four diffusion contact areas 114, a two-dimensional varactor is formed. The source and drain resistance of the two-dimensional varactor is thereby reduced by this unique layout configuration. In addition, the resistivity of the well junction 100 may be kept high, to improve the variable capacitance, while the varactor resistance is reduced. As will be demonstrated in the equivalent models of the varactor of the present invention, the electrical performance is thereby improved. In general, this approach can be extended to an n-dimensional structure as well. Specifically, the varactor is illustrated for the case where n=2.

Note, in addition, that the width (W) and the length (L) of the sub-cells of the varactor can be varied to change the aspect ratio. The aspect ratio can be tailored to optimize the performance of the varactor.

Figure 11:
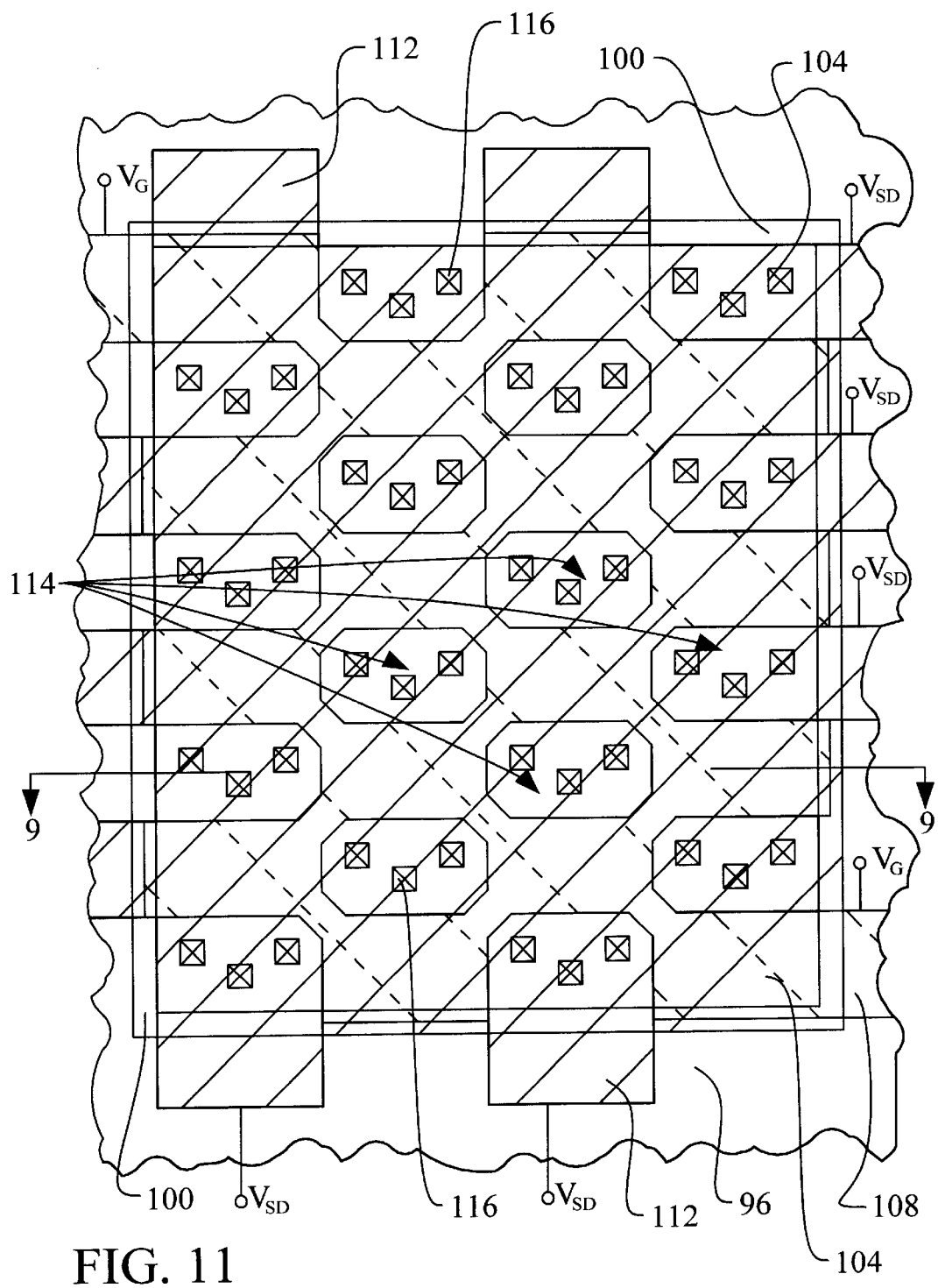

Referring now to FIG. 11, a top view of the partially completed device of FIG. 9 is shown. The interlevel dielectric layer 111, which is not shown, overlies the top electrode 108 and the diffusion junctions 104. The contact openings 116 are formed through the interlevel dielectric layer 111. Note that the two-dimensional array of contact openings 116 is formed in the two-dimensional array of openings in the top electrode 108 to the underlying diffusion junctions 104. The metal layer 112 overlies the interlevel dielectric layer 111 and fills the contact openings 116. The metal layer 112 is patterned to form interconnect lines as shown. Note how the top electrode 108, comprising a single polygon, is labeled as the gate electrode ($V_G$). The diffusion junctions 104 (also called the contact areas 114) are connected together by the metal layer 112 to form the source and drain node ($V_{SD}$).

Figure 12:
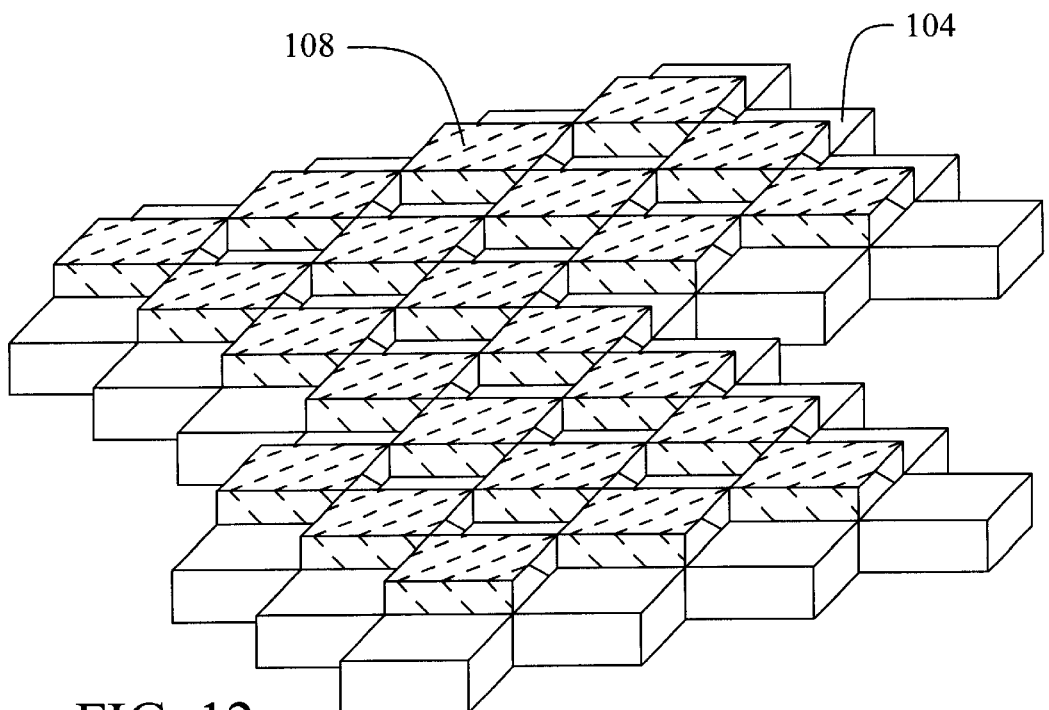
FIGS. 12 and 13 schematically illustrate isometric views of a preferred embodiment of the present invention.

Referring now to FIG. 12, an isometric view of the varactor of the present invention is shown. The polysilicon layer gate plate 108 is shown distributed across the varactor. The diffusion junctions 104 or source and drain regions 104 ring each gate plate 108 to minimize resistance while maximizing the Q-value.

Figure 13:
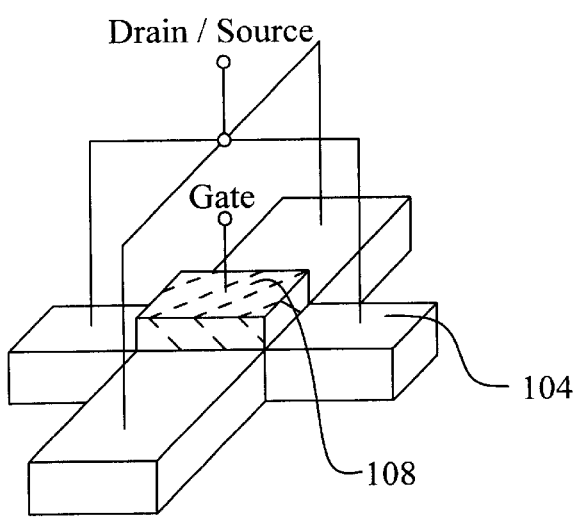

Referring now to FIG. 13, the electrical connectivity of a single cell of the varactor is shown. The top electrode 108 is ringed about by the diffusion junctions 104. The two-dimension varactor device is thereby formed. The drain and source 104 is connected to reduce the resistivity while creating a large Q-value.

Note that as the technology scales down, the oxide capacitance or COX value scales inversely. Therefore, the $C_{dmin}$ value shows a relatively small increase. This means that the downward-scaled technology exhibits a wider tuning range. In addition, note that the parasitic resistance that exists between the drain and source contacts, or diffusion contacts, and the edge of the depletion region constitutes a fundamental limit to the achievable Q value. When the gate length, that is, the distance between the source and drain regions, is scaled down, the parasitic resistance decreases and thereby causes the Q value to increase.

Figure 14:
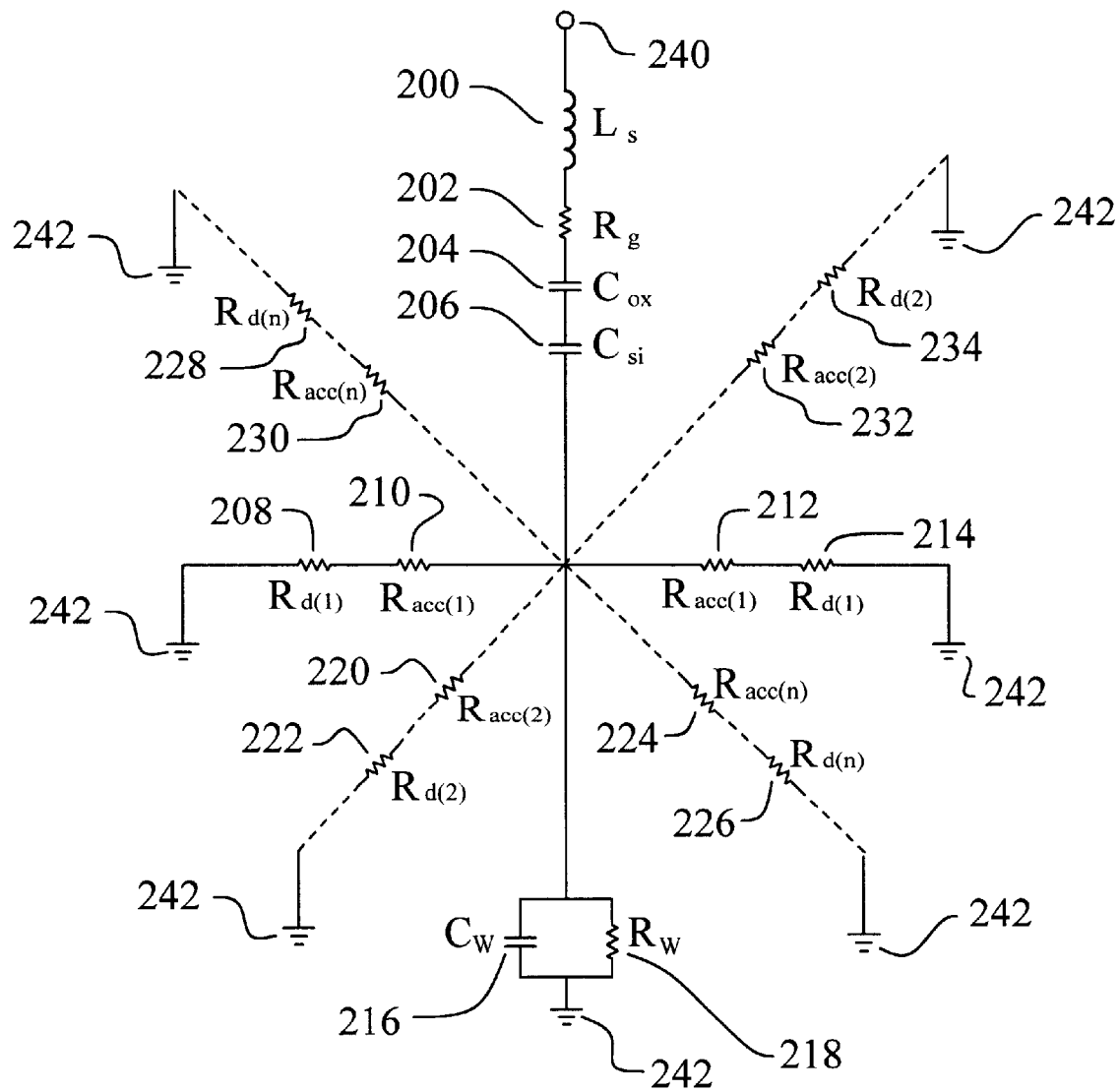
FIGS. 14 and 15 schematically illustrate equivalent circuit models for a preferred embodiment of the MOS varactor of the present invention in accumulation and depletion modes.

Referring now to FIG. 14, an equivalent circuit model of the varactor of the present invention in the accumulation mode is shown. The varactor is again modeled as a series of passive components connected in a network. The gate electrode is modeled as a series inductance ($L_s$) 200, a gate resistance ($R_g$) 202, a gate oxide capacitance ($C_{ox}$) 204, and a semiconductor capacitance ($C_{si}$) 206. The substrate is modeled as a well capacitance ($C_w$) 216 and a well resistance ($R_w$) 218. Note that the drain and source regions now reflect the multidimensional layout of the varactor.

The drain and source regions are modeled as: a first dimension accumulation layer resistance ($R_{acc(1)}$) 210 and 212, a second dimension accumulation layer resistance ($R_{acc(2)}$) 220 and 232, and, if n>2, an nth dimension accumulation layer resistance ($R_{acc(n)}$) 224 and 230. In addition, the drain and source regions include: a first dimension lightly doped drain (LDD) and contact resistance ($R_{d(1)}$) 208 and 214, a second dimension lightly doped drain (LDD) and contact resistance ($R_{d(2)}$) 222 and 234, and, if n>2, an nth dimension lightly doped drain (LDD) and contact resistance ($R_{d(n)}$) 226 and 228. The dummy drain and source and the substrate are grounded 242 while the variable voltage is applied to the gate 240.

Figure 15:
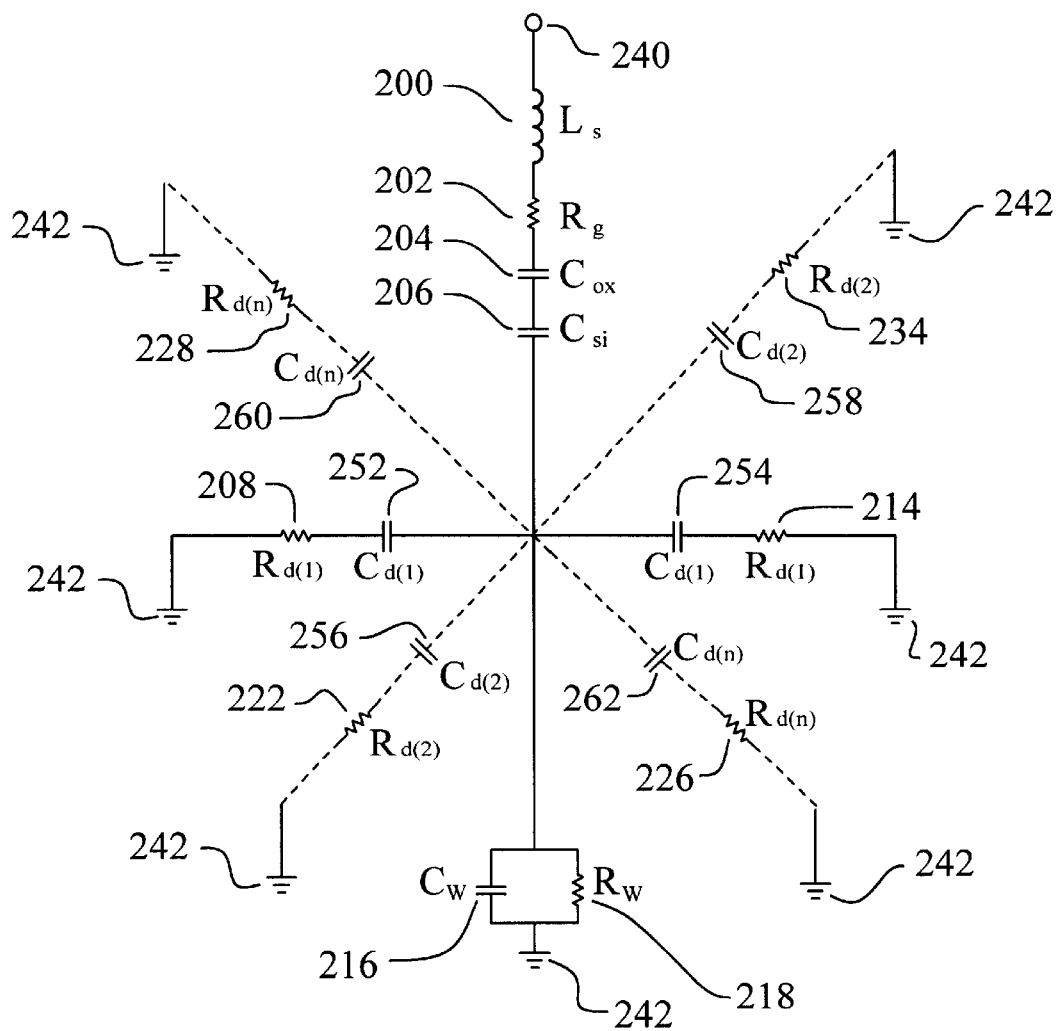

Referring now to FIG. 15, an equivalent circuit model of the prior art varactor in the depletion mode is shown. The gate electrode is modeled as a series inductance ($L_s$) 200, a gate resistance ($R_g$) 202, a gate oxide capacitance ($C_{ox}$) 204, and a semiconductor capacitance ($C_{si}$0) 206. The substrate is modeled as a well capacitance ($C_w$) 216 and a well resistance ($R_w$) 218. Note that the dummy drain and source regions also reflect the multidimensional layout of the varactor. The drain and source regions are modeled as: a first dimension channel-to-source/drain depletion capacitance ($C_{d(1)}$) 252 and 254, a second dimension channel-to-source/drain depletion capacitance ($C_{d(2)}$) 256 and 258, and, if n>2, an nth dimension channel-to-source/drain depletion capacitance ($C_{d(n)}$) 260 and 262. In addition, the drain and source are modeled as: a first dimension lightly doped drain (LDD) and contact resistance ($R_{d(1)}$) 208 and 214, a second dimension lightly doped drain (LDD) and contact resistance ($R_{d(2)}$) 222 and 234, and, if n>2, an nth dimension lightly doped drain (LDD) and contact resistance ($R_{d(n)}$) 226 and 228. The dummy drain and source and the substrate are grounded 242 while the variable voltage is applied to the gate 240.

The changes in the equivalent circuit model of the varactor from the accumulation mode (FIG. 14) to the depletion mode (FIG. 15) reflect the presence of the depletion region underlying the gate oxide layer 14 during depletion mode. The two-dimensional layout of the varactor of the present invention reduces the effective series resistance. The effective series resistance of the varactor of the present invention in accumulation mode is given by:

$$R_s = R_{acc(1)}/2 \| R_{acc(2)}/2.$$

The effective series resistance of the varactor of the present invention in depletion mode is given by:

$$R_s = R_w(C_{si}/(C_{si}+2(C_{d(1)}\|C_{d(2)})))^2.$$

effective series capacitance of the varactor of the present invention in the accumulation mode is given by:

$$C_s = C_{ox}C_{si}/(C_{ox}+C_{si}).$$

the effective series capacitance of the varactor of the present invention in the depletion mode is given by:

$$C_s = (C_{si}+2(C_{d(1)}\|C_{d(2)}))/(C_{ox}+C_{si}+2(C_{d(1)}\|C_{d(2)})).$$

When the applied voltage VG is changed from far above the flatband voltage to far below the flatband voltage, the varactor will operate from deep accumulation to strong depletion, and the capacitance will then vary from a maximum to a minimum value. The improvement in Q-value of the present invention (n=2) compared to the prior art is seen in the accumulation mode by:

$$Q_{new}/Q_{prior} = [(R_{acc(1)}/2)/(R_{acc(1)}/2 \| R_{acc(2)}/2)] > 1$$

In depletion mode, the ratio is given by:

$$Q_{new}/Q_{prior} = [[C_{ox}(C_{si}+2(C_{d(1)}\|C_{d(2)})][C_{si}+2(C_{si}+2(C_{d(1)}\|C_{d(2)})/ [C_{ox}+C_{si}+2C_{d(1)}][C_{si}+2C_{d(1)}]] > 1$$

Figure 16:
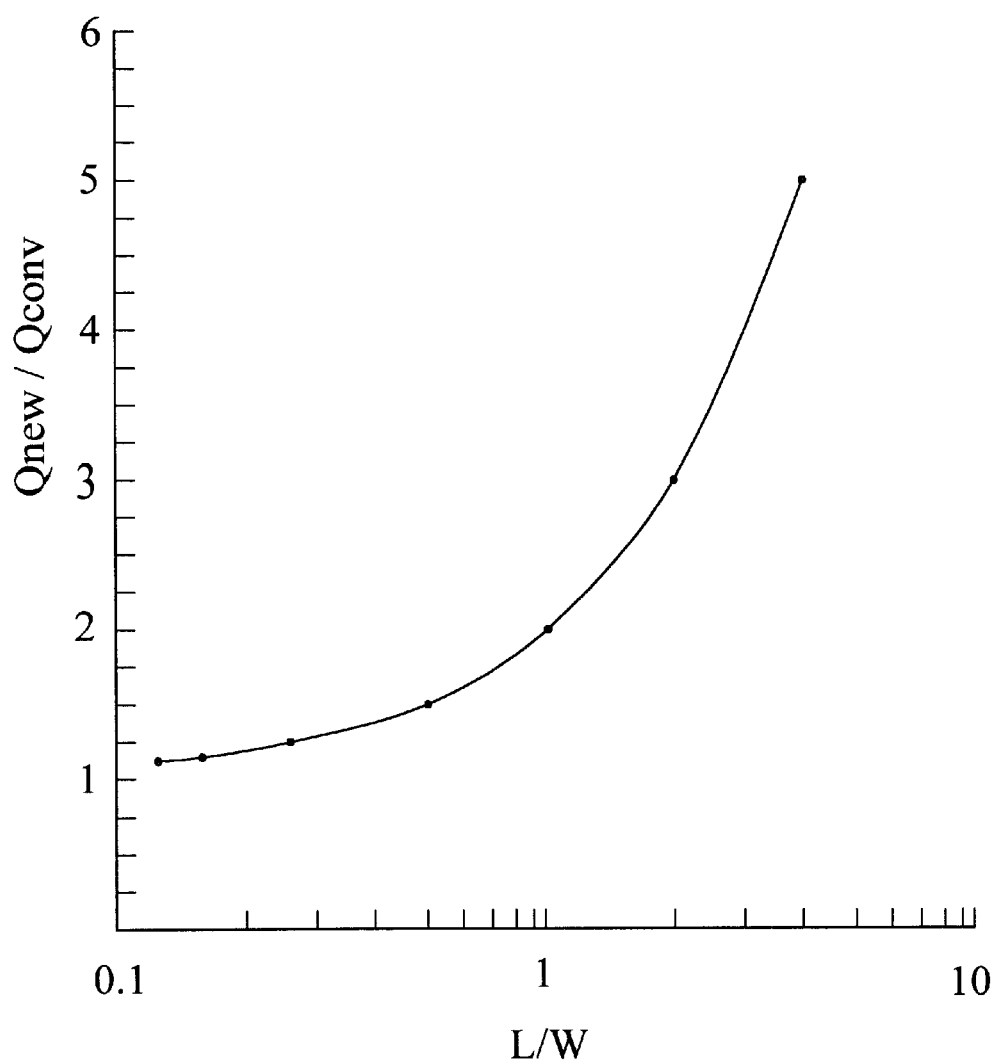
FIG. 16 graphically illustrates the ratio of the Q-value of the varactor of the present invention and the Q-value of the prior art varactor versus the aspect ratio of the gate.

Referring now to FIG. 16, the performance of the prior art varactor is compared to the performance of the present invention varactor for the two-dimensional case. FIG. 16 graphically illustrates the ratio of the Q-value of the varactor of the present invention and the Q-value of the prior art varactor for various gate aspect ratios.

It is clear from the models that the new layout has a lower series resistance ($R_s$) than the conventional design. This leads to a higher quality factor (Q). It also is clear that the new varactor outperforms the conventional varactor for different aspect ratios. Although, in general, a small aspect ratio should be used for the new varactor in order to obtain a high Q, it does not necessarily give the maximum Q. The optimum aspect ratio for the new varactor, to obtain the maximum Q, will very much depend on the technology capabilities.

The advantages of the process of the present invention can now be enumerated. First, an effective process for creating a unique, multidimensional varactor has been demonstrated. Second, the varactor method is compatible with a standard CMOS process. Third, the disclosed varactor device demonstrates an improved Q-value.

As shown in the preferred embodiment, the present invention discloses a unique varactor device and achieves a very manufacturable process for fabricating a varactor with improved Q-value in the manufacture of integrated circuit devices.

While the invention has been particularly shown and described with reference to the preferred embodiments thereof, it will be understood by those skilled in the art that various changes in form and details may be made without departing from the spirit and scope of the invention.

What is claimed is:

1. A varactor device comprising:
   a bottom electrode comprising a plurality of diffusion junctions in a semiconductor substrate wherein said diffusion junctions are arranged in a two-dimensional array;
   a dielectric layer overlying said semiconductor substrate;
   a top electrode overlying said dielectric layer wherein said top electrode comprises a single polygon containing a two-dimensional array of openings therein that expose said diffusion junctions and a two-dimensional array of top electrode locations wherein said too electrode locations are surrounded by four said diffusion junctions;
   an interlevel dielectric layer overlying said top electrode and said diffusion junctions wherein said interlevel dielectric layer has a two-dimensional array of contact openings that expose underlying said diffusion junctions; and
   a patterned metal layer overlying said interlevel dielectric layer and contacting said diffusion junctions through said contact openings.

2. The device according to claim 1 wherein said semiconductor substrate comprises a doping type of the group of: n-type and p-type.

3. The device according to claim 1 wherein said diffusion junctions comprise one of the group of: n-type doping and p-type doping.

4. The device according to claim 1 further comprising a well junction in said semiconductor substrate wherein said diffusion junctions are contained in said well junctions.

5. The device according to claim 4 wherein said well junction comprises one of the group of: n-well and p-well.

6. The device according to claim 1 wherein said dielectric layer comprises silicon dioxide.

7. The device according to claim 1 wherein said top electrode comprises polysilicon.

8. The device according to claim 1 wherein said interlevel dielectric layer comprises silicon dioxide.

9. The device according to claim 1 wherein said metal layer comprises one of the group of: aluminum and aluminum alloys.

10. A varactor device comprising:
    a bottom electrode comprising a plurality of diffusion junctions in a semiconductor substrate wherein said diffusion junctions are arranged in a two-dimensional array, wherein said diffusion junctions are n-type, and wherein said diffusion junctions are contained in an n-well junction;
    a dielectric layer overlying said diffusion junctions;
    a top electrode overlying said dielectric layer wherein said top electrode comprises a single polygon containing a two-dimensional array of openings therein that expose said diffusion junctions and a two-dimensional array of top electrode locations wherein said top electrode locations are surrounded by four said diffusion junctions;
    an interlevel dielectric layer overlying said top electrode and said diffusion junction wherein said interlevel dielectric layer has a two-dimensional array of contact openings that expose underlying said diffusion junction; and
    a patterned metal layer overlying said interlevel dielectric layer and contacting said diffusion junction through said contact openings.

11. The device according to claim 9 wherein said dielectric layer comprises silicon dioxide.

12. The device according to claim 9 wherein said top electrode comprises a polysilicon layer.

13. The device according to claim 9 wherein said interlevel dielectric layer comprises silicon dioxide.

14. The device according to claim 9 wherein said metal layer comprises one of the group of: aluminum and aluminum alloys.

15. A method to form a varactor device in the manufacture of an integrated circuit device comprising:
    providing a semiconductor substrate;
    forming a dielectric layer overlying said semiconductor substrate;
    depositing a top electrode layer overlying said dielectric layer;
    patterning said top electrode layer to form a top electrode wherein a single polygon containing a two dimensional array of openings and a two-dimensional array of top electrode locations is formed therein;
    thereafter implanting ions into said semiconductor substrate through said two-dimensional array of openings to thereby form a two-dimensional array of diffusion junctions wherein said top electrode locations are surrounded by four said diffusion junctions;
    thereafter depositing an interlevel dielectric layer overlying said top electrode and said diffusion junctions;
    patterning said interlevel dielectric layer to form a two-dimensional array of contact openings to underlying said diffusion junctions;
    depositing a metal layer overlying said interlevel dielectric layer and filling said contact openings; and
    patterning said metal layer to complete the manufacture of said integrated circuit device.

16. The method according to claim 15 wherein said diffusion junctions comprises one of the group of: n-type doped junction and p-type doped junction.

17. The method according to claim 15 further comprising forming a well junction in said semiconductor substrate before said step of forming a dielectric layer wherein said well junction comprises one of the group of: n-well and p-well and wherein said diffusion junctions are contained in said well junction.

18. The method according to claim 15 wherein said dielectric layer comprises silicon dioxide.

19. The method according to claim 15 wherein said top electrode layer comprises polysilicon.

20. The method according to claim 15 wherein said interlevel dielectric layer comprises silicon dioxide.

* * * * *